United States Patent [19]

Potter

[11] Patent Number: 5,262,030
[45] Date of Patent: Nov. 16, 1993

[54] MAGNETRON SPUTTERING CATHODE WITH ELECTRICALLY VARIABLE SOURCE SIZE AND LOCATION FOR COATING MULTIPLE SUBSTRATES

[75] Inventor: Robert I. Potter, San Jose, Calif.

[73] Assignee: Alum Rock Technology, San Jose, Calif.

[21] Appl. No.: 821,390

[22] Filed: Jan. 15, 1992

[51] Int. Cl.⁵ .............................................. C23C 14/35
[52] U.S. Cl. ............................ 204/298.2; 204/298.09
[58] Field of Search ......................... 204/298.09, 298.2

[56] References Cited

U.S. PATENT DOCUMENTS

| | | | |
|---|---|---|---|
| 3,649,512 | 3/1972 | Ackley | 204/298.09 |
| 3,718,572 | 2/1973 | Robison et al. | 204/298.09 |

FOREIGN PATENT DOCUMENTS

| | | | |
|---|---|---|---|
| 2707144 | 8/1977 | Fed. Rep. of Germany | 204/298.2 |
| 53-72790 | 6/1978 | Japan | 204/298.2 |
| 53-132482 | 11/1978 | Japan | 204/298.2 |
| 63-282262 | 11/1988 | Japan | 204/298.2 |
| 1-180977 | 7/1989 | Japan | 204/298.2 |
| 2-30757 | 2/1990 | Japan | 204/298.2 |
| 2-8366 | 11/1990 | Japan | 204/298.2 |

Primary Examiner—Aaron Weisstuch
Attorney, Agent, or Firm—Nathan N. Kallman

[57] ABSTRACT

In a magnetron sputtering cathode, the magnetic field is translated across the face of the sputtering target. The magnetic field determines the region from which most material from the target is ejected, and therefore the cathode provides a means of electrically varying the size, shape or location of the active region on the face of the target. The cathode may be used to coat a large number of substrates by sweeping the magnetic field across a large target rather than mechanically transporting the substrates across a small fixed target. The cathode allows more efficient utilization of the target through rapid and periodic changes in the size or location of the magnetic field and associated target erosion. These changes prevent formation of the localized and deep erosion ring that develops on targets used with existing cathode designs and relieves the requirement that the target be changed before the bulk of the material is consumed. In one design the circular or rectangular magnetic field pattern is expanded or contracted radially. An alternative design allows translation of the magnetic field pattern. Another design provides more general two dimensional control of the field pattern and provides a novel means of cooling the target as well.

4 Claims, 7 Drawing Sheets

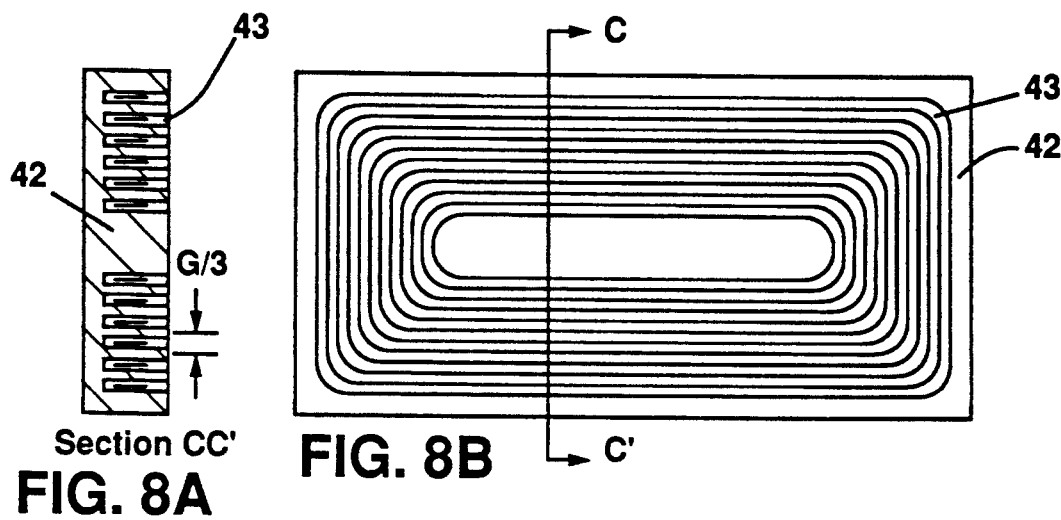
Section CC'
FIG. 8A
FIG. 8B
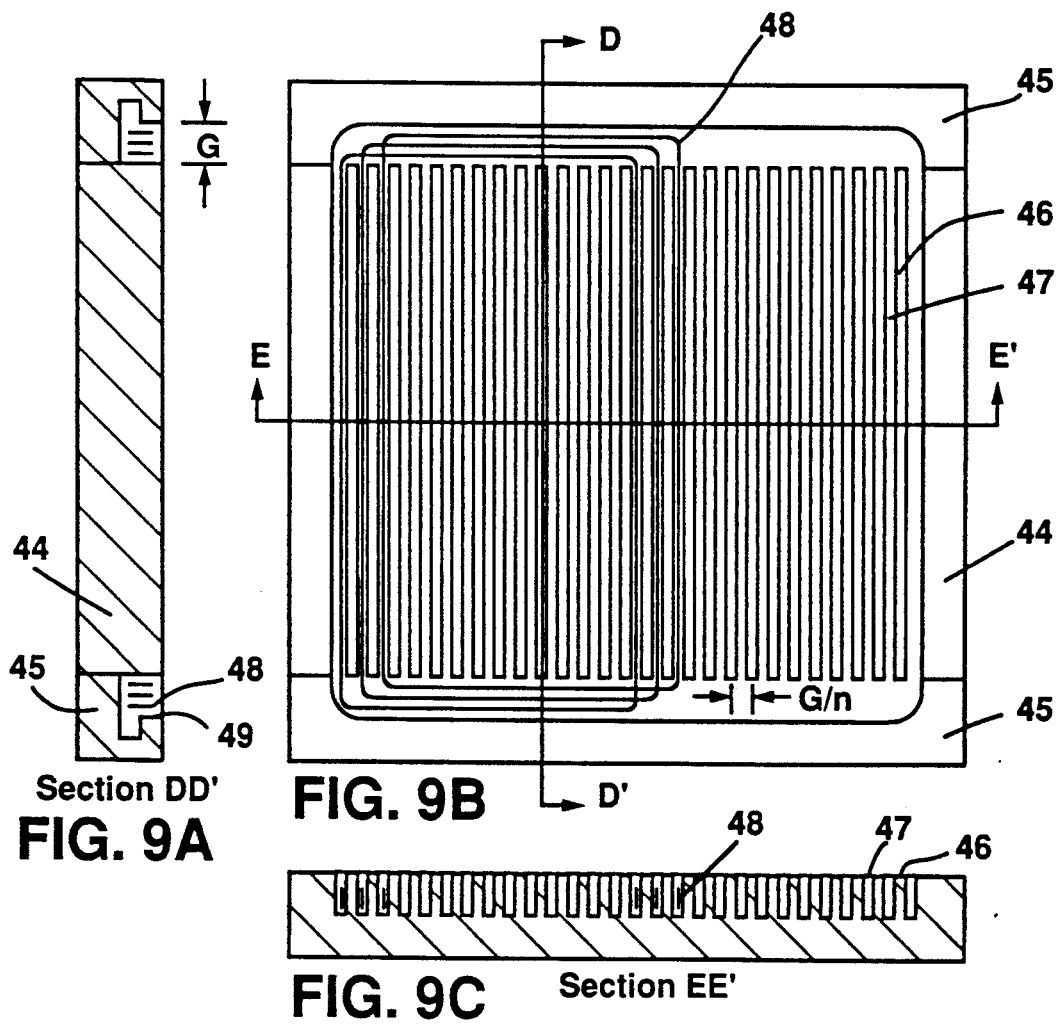
Section DD'
FIG. 9A
FIG. 9B
FIG. 9C Section EE'

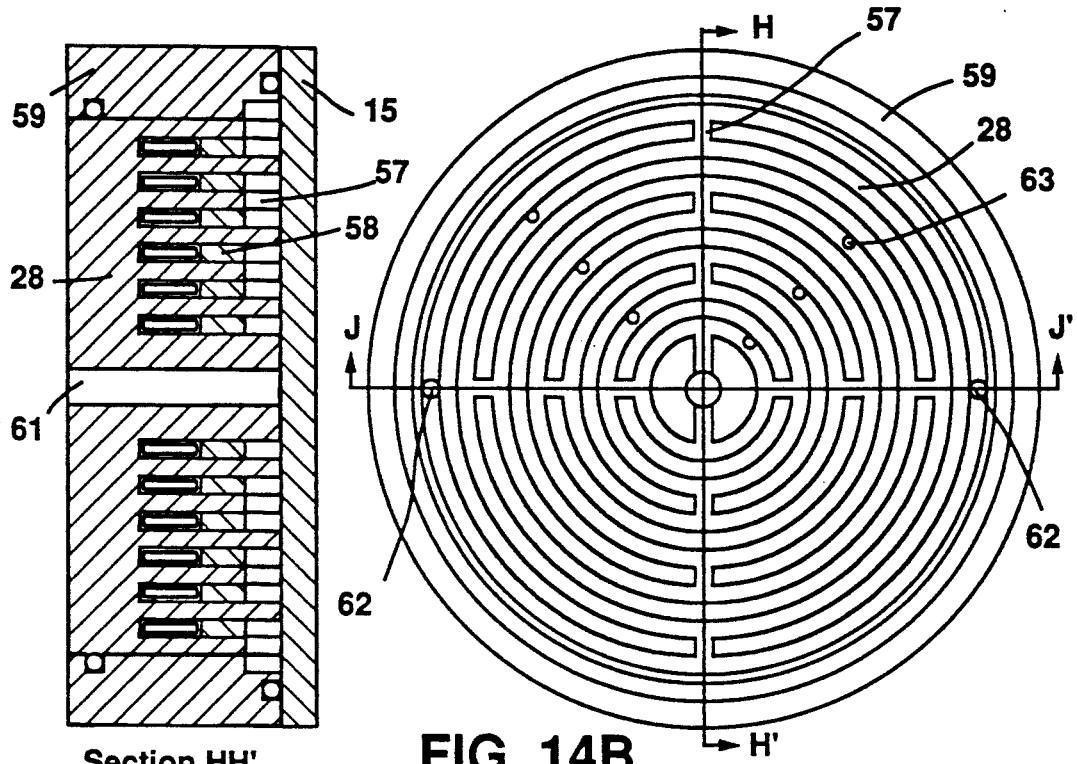
FIG. 14A Section HH'
FIG. 14B
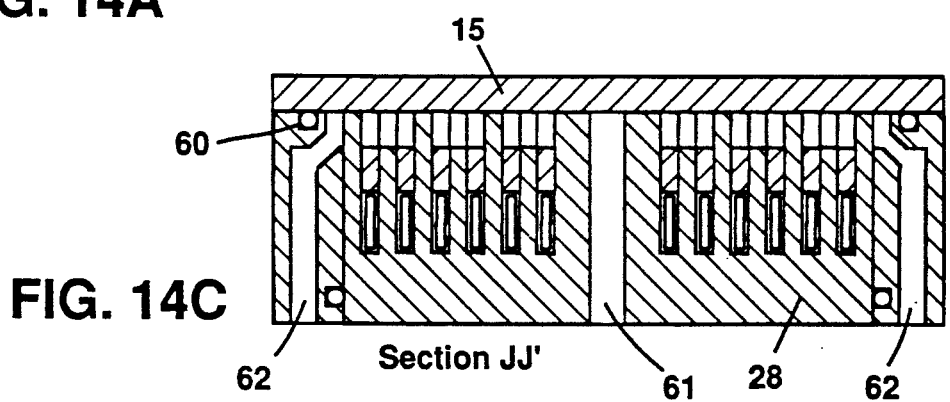
FIG. 14C Section JJ'

MAGNETRON SPUTTERING CATHODE WITH ELECTRICALLY VARIABLE SOURCE SIZE AND LOCATION FOR COATING MULTIPLE SUBSTRATES

FIELD OF THE INVENTION

This invention relates to vacuum coating apparatus and to a method of coating magnetic and nonmagnetic materials using magnetron sputter coating sources.

DESCRIPTION OF THE PRIOR ART

Magnetron systems typically incorporate a vacuum system that functions under the joint action of an externally applied magnetic field and the electric field between its anode and cathode. In its common form it comprises a flat cathode and a parallel anode structure. An electric field is created by applying a high DC potential between the cathode and anode structure while the magnetic field is applied longitudinally by external permanent or electro magnets. One use of a magnetron system is for sputtering deposition of a specified material onto a substrate. A target in the shape of a disk or rectangular plate, for example, made of the material to be deposited is placed parallel to and spaced apart from the substrate to be coated. The region between the two is evacuated and then backfilled with a sputtering gas such as argon. A potential difference sufficient to ionize the gas and create a plasma is maintained across the substrate and target. The ions are accelerated to the target and upon impact eject target material, some of which reaches and adheres to the substrate. A direct current supply is generally used when the target and substrate are conductive. This technique, known as DC diode sputtering, is characterized by a plasma that is substantially uniform in the volume between the target and substrate and by a low deposition rate.

The process is greatly enhanced by providing a magnetic field substantially parallel and adjacent to the target. This field intensifies and confines the plasma to the target region and greatly improves the efficiency of the process. Known as magnetron sputtering, this process allows deposition rates of approximately one micrometer per minute.

A schematic representation of a typical prior art magnetron sputtering apparatus is shown in cross section in FIG. 1. A chamber 11 is evacuated and the interior region 12 is partially backfilled with a sputtering gas such as argon. Not shown are the pumps, valves and other hardware associated with maintaining this low pressure environment. The chamber contains the substrate or part 13 to be coated which is supported or transported into the chamber by means 14. The substrate is usually in electrical contact with the chamber which is at ground potential. The material with which the substrate is to be coated is fabricated into a target 15. This target forms a part of the chamber walls and is insulated from the walls by means 16 and maintained at a suitable negative potential by a power supply 17. A magnetic field 18 which is substantially parallel to the target on the side of the target facing the substrate is generated by an electromagnet comprised of a yoke of magnetizable material 19 and a coil 20, as described in U.S. Pat. No. 4,500,409 to Boys et al. Alternate approaches use permanent magnets to generate substantially the same magnetic field distribution. Typically, the magnetic field required is approximately 100 oersteds parallel to the target in the region of the plasma.

An undesirable characteristic of magnetron sputtering is that the target is eroded more rapidly in regions where the magnetic field is more intense. If the magnetic field is to be parallel to and of appreciable magnitude only near the face of the target, then it follows that the field must be localized along the field direction, which is the radial direction for a round cathode. Erosion patterns for both round and rectangular targets are shown in FIGS. 2A, 2B, and 2C. FIG. 2A is a cross-sectional view of both the round and rectangular targets shown in the plan views of FIGS. 2B and 2C. As the targets erode, the erosion ring 22 further concentrates the magnetic field and compounds the problem. When the ring groove 22 approaches the thickness of the target 15, the coating process must be stopped, the vacuum system must be opened, and the target must be replaced, even though the bulk of the target has not been consumed. This is a serious problem because of the cost of the material and the production time lost. Current expenditures for sputtering targets in the rigid computer disk industry are about $100 million per year, or about $1 per disk. A sputtering cathode which would improve target utilization only 20 percent would save $20 million per year in target costs in this industry alone.

Another undesirable problem with magnetron sputtering is that targets made out of magnetic materials, such as Permalloy or the various cobalt alloys used for depositing the recording layer for computer disks, tend to prevent the magnetic field 18 from reaching the plasma.

Another problem is that the existing magnetron sputtering cathode designs are not flexible with respect to different sized substrates. FIG. 3 shows one widely used method for coating recording disk substrates in which the substrates 23 are placed one at a time between a pair of cathodes 24. Considerations of coating uniformity and conservation of target material dictate a reasonably tight relationship between the diameter of the cathode and the diameter of the substrate to be coated.

The pass-by method of coating recording disks shown in FIG. 4 is an attempt around this size restriction. It also is an attempt to increase the throughput of the coating machine. In this method substrates 23 are placed in a pallet 25 which is slowly moved through a pair of rectangular cathodes 26. The pass-by method introduces undesirable disk modulation because of the unidirectional way in which the disk is coated and the targets still have to be changed often.

Another problem in common with all previous designs is the substantial amount of moving machinery that must be included within the vacuum system in order to transport the substrates. All known prior art magnetron sputter coating systems use one or a few localized, intense stationary sources and transport a relatively large amount of substrate area past those sources, either continuously or by step-and-repeat motion. The magnitude of the problem associated with this mechanical motion can be appreciated by observing that a deposition rate of one micrometer per minute for 40 hours per week amounts to a thickness of 4.7 inches per year. Not all of this material is carried away on the substrates. The debris generated when some of the stray material is disturbed is a source of coating defects and equipment failures.

SUMMARY OF THE INVENTION

An object of this invention is to provide a method and means of obtaining more efficient target utilization by being able to vary the location of the magnetic field through external electrical means, and thereby spread the target erosion more uniformly over the surface of the target.

Another object of this invention to provide a method and means of electrically adjusting the location, size and shape of the magnetic field within the plasma, and thereby allow one cathode and target to be used efficiently with substrates of varying size.

Another object is to provide a method and means of accommodating targets of various magnetic characteristics and states of depletion.

A further object is to provide a way of uniformly coating substrates mounted on large pallets, without producing orientation effects such as disk modulation, and without the need for mechanical motion within the vacuum chamber during the coating process.

In accordance with this invention, the magnetic field and associated plasma produced in a magnetron sputter coating system are electrically moved across the face of a suitable large target while the substrates are stationary. The novel apparatus provides a means of creating arbitrary two-dimensional plasma patterns. Specialized versions provide sufficient flexibility for many applications. Examples of specialized versions with one degree of freedom are cathodes in which a plasma of fixed shape may be translated along one axis only, and cathodes where the center of the pattern is fixed but the size of the pattern may be varied. The magnetic structure of the sputter coating apparatus is formed as a backplane of magnetically soft material onto which a large number of poles of magnetically soft material are affixed, and a large number of current carrying coils oriented parallel to that backplane and encompassing one or more of the poles. The plasma is controlled by selectively energizing these coils using a computer or other control means. Specific and practical examples of this structure will be described.

In one application a cathode with two degrees of freedom has the shape of a large rectangle or square and is approximately the size of the pallets used in existing disk sputtering machines. The standard racetrack-shaped magnetic field pattern (or any other pattern) is formed at one end of the cathode and moved from end to end, reformed with the long axis of the racetrack horizontal, and moved from top to bottom. This or any other cycle is repeated a large number of times during the time required to coat the substrates. Such a cathode coats substrates at the same rate as the conventional cathode used with the passby coating method. It uses the same power supply because the total power in the plasma is the same. It provides uniform erosion of the target and therefore nearly 100 percent target utilization. The time between target changes is extended by the ratio of the new and old target areas times the target utilization improvement factor.

An example of a cathode with one degree of freedom for the above application is a cathode in which the plasma pattern is by design a racetrack. The racetrack is smoothly translated back and forth along one axis only. This cathode provides most of the benefits of the more general two dimensional cathode at a lower cost.

In some applications the cathode embodying the concepts of this invention has the same size and is physically interchangeable with existing cathodes. These cathodes primarily provide greatly improved target utilization and, as a related benefit, less machine down time. They also permit greater flexibility with respect to different substrate sizes. For example, the active sputtering region of a round cathode may be electrically adjusted for a particular recording disk substrate diameter. A round cathode in which the field is azimuthally symmetric but is controllable in the radial direction is also an example of a cathode with one degree of freedom.

These objectives are achieved by constructing the desired magnetic field distribution from a large number of small magnetic fields, much in the way an image is generated on the face of a cathode ray tube through a large number of pixels. Nearly continuous translation of a given field distribution can be achieved by selective activation of the appropriate "magnetic pixels" in analogy with the cathode ray tube image. The resolution achievable is dependent on the "magnetic pixel" density. Adequate resolution for sputtering purposes is achievable with commercially viable techniques.

BRIEF DESCRIPTION OF THE DRAWINGS

The invention will be described with reference to the drawings in which:

FIGS. 8A and 8B are cross-sectional and plan views of the magnetic structure of a rectangular sputtering source made in accordance with this invention, respectively;

FIGS. 9A, 9B and 9C are cross-sectional, plan, and cross-sectional views, respectively, of the magnetic structure of a sputtering source providing translational capabilities and made in accordance with this invention;

FIGS. 14A, 14B, and 14C are cross-sectional, plan, and cross sectional views, respectively, of the magnetic structure and water cooling channels of a sputtering source made in accordance with the principles of this invention, with the target omitted in FIG. 14B.

DESCRIPTION OF THE INVENTION

Figure 5:
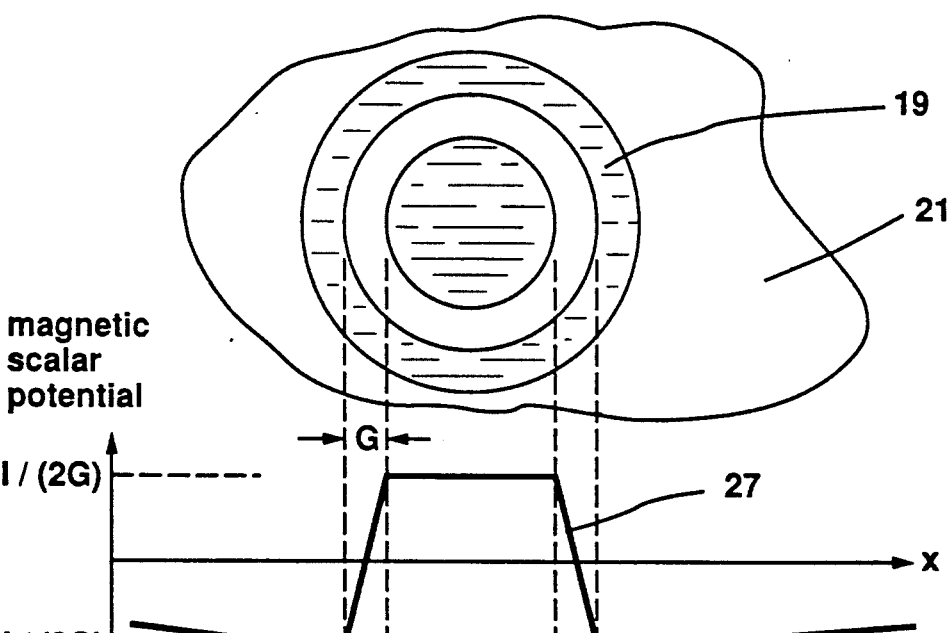
FIG. 5 is a graph of the magnetic scalar potential on the surface of the plane directly in front of a round magnetron sputtering source.

The magnetic field in a region of space which is free of electrical currents can be expressed in terms of and is uniquely determined by the magnetic scalar potential on the boundary of that space. In particular and with reference to FIG. 1, the half space to the right of the mathematical plane 21 can be expressed in terms of the potential on that plane. Plane 21 is shown again in plan view in FIG. 5, and the yoke 19 typical of current art shown in FIG. 1 is shown again dotted in FIG. 5. For the sake of comparisons made below, it is assumed that yoke 19 has an inner pole piece of outside radius R1 and an outer pole piece of inside radius R2 with R2−R1=G and that the coil 20 carries a current I.

Figure 1:
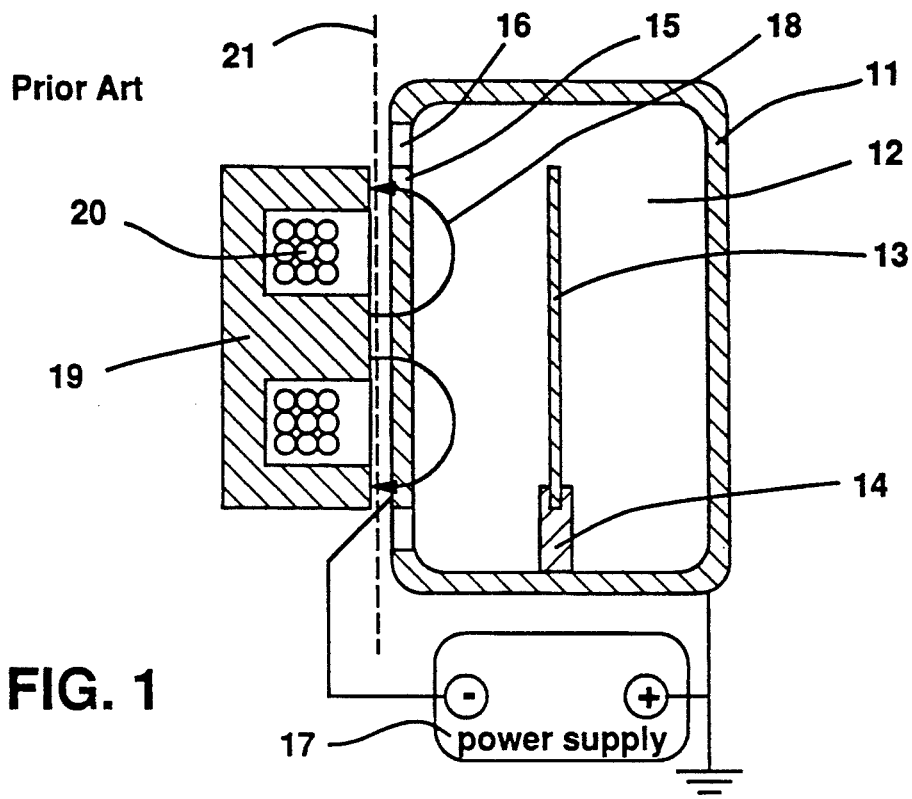
FIG. 1 is a cross-sectional view of a typical magnetron sputtering system.
Figures 2A, 2B, 2C:
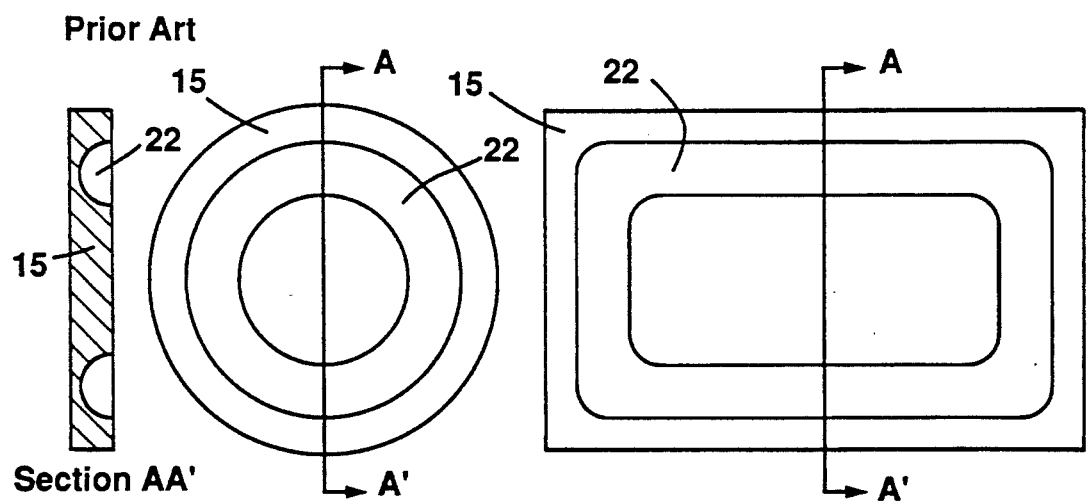
FIG. 2A is a cross-sectional view of a sputtering target.
FIGS. 2B and 2C are plan views of round and rectangular sputtering targets, respectively.
Figure 3:
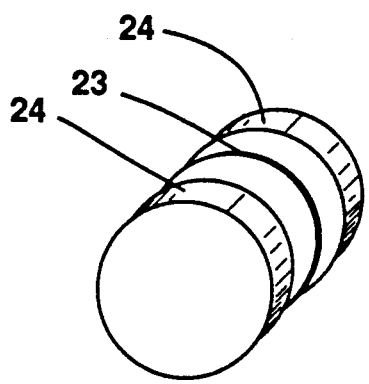
FIG. 3 is an isometric view of a recording disk substrate placed between two round magnetron sputtering sources.
Figure 4:
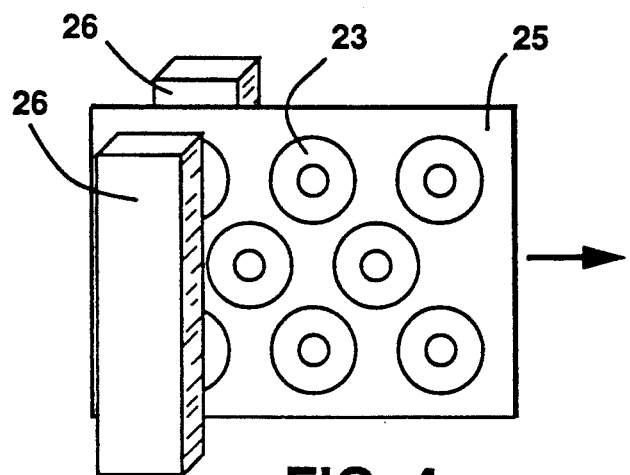
FIG. 4 is an isometric view of a pallet containing recording disk substrates and passing between two rectangular magnetron sputtering sources.

The potential on plane 21 for the typical cathode shown in FIG. 1 has azimuthal symmetry and could be plotted as a function of radius. In conformity with other figures to follow, it will be shown as a function of the distance x along a line passing through the central axis of the cathode. An approximation 27 to the magnetic scalar potential on plane 21, which approximation has all of the salient features for the discussion that follows, is shown as a function of x in FIG. 5. When plane 21 is located at the surface of yoke 19 and for simplicity ignoring whatever magnetic inefficiency yoke 19 might have, the maximum positive and negative amplitude of potential 27 is I/(2G).

Figure 6A:
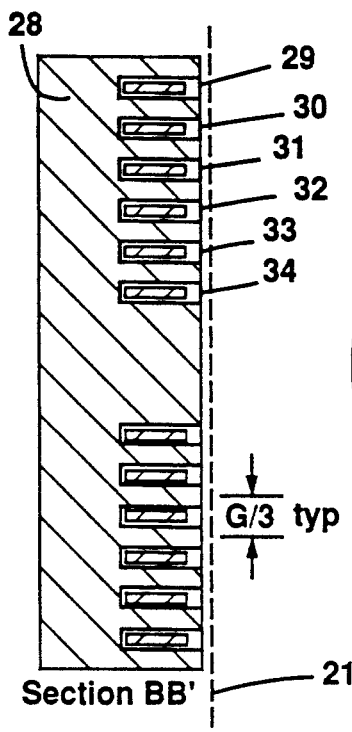
FIG. 6A is a cross-sectional view of the magnetic structure of a magnetron sputtering source made in accordance with this invention.

Consider now a yoke with a multiplicity N of concentric gaps and coils, where the gaps are small relative to the gap G in the conventional cathode. The operation of this structure, which is one embodiment of the present invention, will be explained by way of example for the special case N=6 and with all gaps of equal width g=G/6 with their centers spaced equal distances G/3. This example is shown in FIG. 6A in cross-sectional view and in FIG. 6B in plan view. Here, the conventional yoke 19 with two annular pole pieces and a single gap is replaced by a structure 28 having, by way of example, seven pole pieces and six gaps 29 through 34.

The structure 28 is fabricated from a permeable magnetic material having a low magnetic coercivity such as Carpenter High Permeability 49 Alloy. Each gap contains a coil which can be selectively energized by wires not shown.

Figure 7:
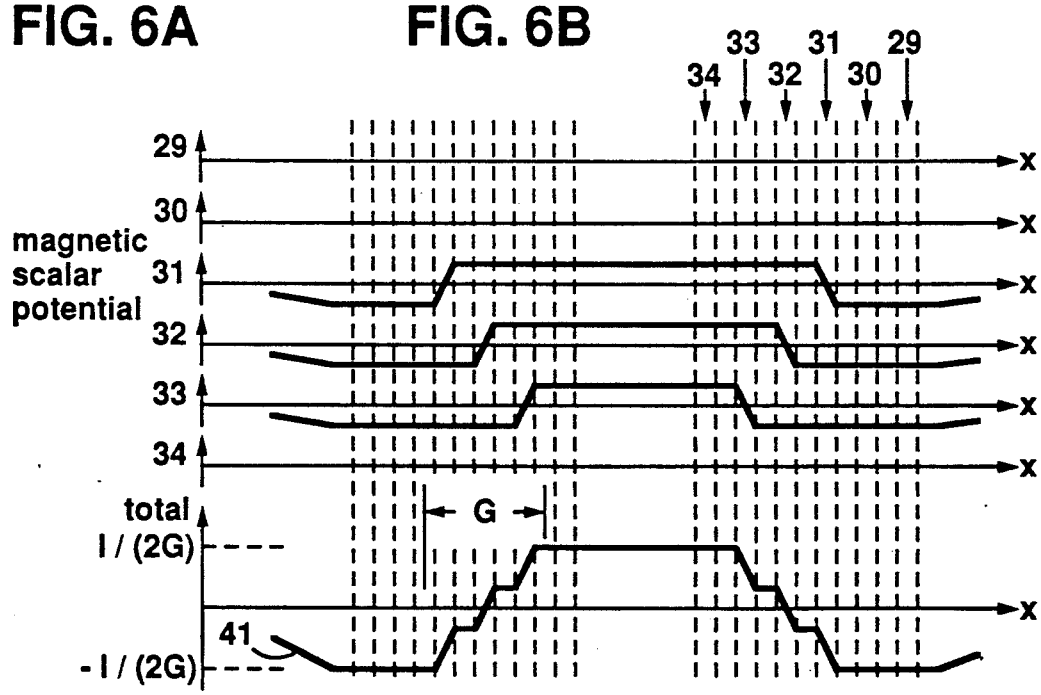
FIG. 7 is a series of graphs of magnetic scalar potentials for the structure shown in FIGS. 6A and 6B.

The potential on plane 21 for this embodiment of the invention and for the case where the coils in gaps 31, 32, and 33 are energized one at a time with a current of magnitude I/3 is shown in FIG. 7. As before, it will be understood that these curves are approximations to the exact curves but have all of the features necessary for understanding the operation of the invention. The potential on the surface of a region free of currents is the sum of the potentials due to each exterior current source taken separately. Therefore, the potential on plane 21 is the sum of the potentials due to each activated coil. For example, when the three coils 31, 32, and 33 are simultaneously energized, the potential is the curve 41 shown in FIG. 7. This curve will be recognized as substantially the same curve 27 shown in FIG. 5, and therefore this embodiment with 31, 32, and 33 energized produces substantially the same magnetic field within the plasma as does the typical structure shown in FIGS. 1 and 5. The fine structure of curve 41 consisting of n-1 small steps (in this example n=3) has little effect on the magnetic field in the plasma, which is approximately a distance G from plane 21. Moreover, the steps can be made as small as desired through suitable choice of n. A practical value for n is considered to be about 4.

The difference between the embodiment of the present invention shown in FIGS. 6 and 7 and previous art is that curve 41 can be modified at will by the appropriate energization of the coils in gaps 29 through 34. For example energizing the coil in gap 30 and de-energizing the coil in gap 33 would cause the potential on plane 21 and the associated magnetic field in the plasma to shift radially outward a distance of G/3. Thus by repetition of this process the region of intense plasma can be smoothly oscillated radially in and out, covering substantially all of the target and thereby utilizing most of the target material. Alternatively, the radius of the plasma can be adjusted for a particular substrate diameter. Moreover, the number n of adjacent coils energized at one time can be changed to accommodate the magnetic characteristics or condition of a particular target, or targets of varying thickness.

It will also be appreciated that the embodiment just described is inherently an efficient magnetic structure. All currents contribute to the desired magnetic field. Although the use of multiple gaps reduces the winding window available for the active coils, this is not a limitation in practice. For the case where the pole widths and gap widths are equal, as in the example above, the reduction factor is 0.5.

The design described above is applicable to cathodes of rectangular or other shapes by employing concentric gaps and coils. The rectangular cathode with N=6 shown in cross-sectional view in FIG. 8A and in plan view in FIG. 8B has a structure 42 analogous to 28. Structure 42 is made of similar magnetic material and has 6 concentric gaps with coils 43 analogous to 29 through 34.

Another class of cathodes will now be described, in which the region of intense magnetic field is translated along a fixed axis across the face of the cathode rather than expanded and contracted with its center fixed. A rectangular cathode in which the racetrack-shaped region of intense magnetic field is translated in either direction along its minor axis is shown in FIG. 9B in plan view and FIGS. 9A and 9C in cross sectional view. The embodiment shown consists of comb 44 and two end caps 45 all made of magnetic material such as Carpenter High Permeability 49 Alloy. Comb 44 has a large number of pole pieces 46 and slots or gaps 47, each spaced a center to center distance G/n from its neighbors, where G is typical of the pole separation needed in a conventional design and n is an integer which determines the smoothness of the translation as before. End caps 45 form a gap of approximate width G between poles 46 and end pole piece 49. The end caps are in magnetic contact with the base of comb 44 and are secured by means not shown.

Coils 48 (only three of which are shown in FIGS. 9A, 9B, and 9C) are wound on a suitable mandril and then placed in slots 47 so that each coil contains q=n+m−1 of the poles 46, where m is the number of poles desired within the racetrack. The number m should be at least equal to n and preferably several times n. The first coil is placed at one end of the comb and subsequent coils are placed at a position G/n from the previous coil until all slots are full. The coils overlap in the end cap region with a maximum number overlapping equal to m+1. Thus the coils should be wound so that they overlap efficiently, and sufficient room must be provided within the end caps. The coil leads are brought out through holes or slots (not shown) in the end caps.

Operation of this rectangular cathode is similar to that of the designs with concentric coils described above. Energizing any n adjacent coils will generate a racetrack-shaped magnetic field within the plasma. The magnetic field at the ends of the racetrack (at the top and bottom of FIG. 9B) is the same as along the sides of the racetrack. This follows because the gap G between the pole piece 49 and the ends of comb pole pieces 46 is n times the width of the gaps on the comb, and the total current at the ends is n(I/n)=I. The racetrack can be translated back and forth at will, and the spatial extent to which the field penetrates the target can be varied within limits by varying the number of adjacent coils that are energized at any one time. One application of this cathode is to coat a large number of substrates held stationary in front of the cathode, thereby achieving the desirable results already described.

Figure 10:
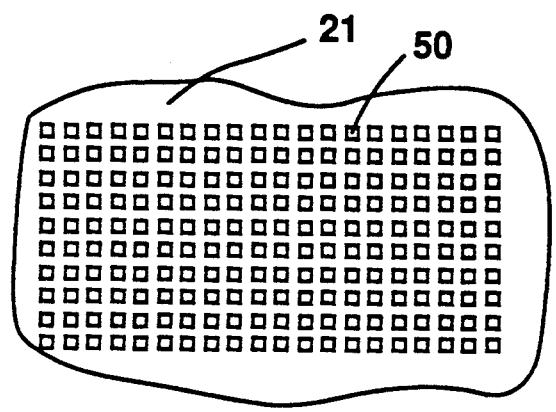
FIGS. 10 and 11 show rectangular and round surface elements, respectively, on a mathematical plane located between the magnetic structure and the target of a magnetron sputtering source.
Figure 11:
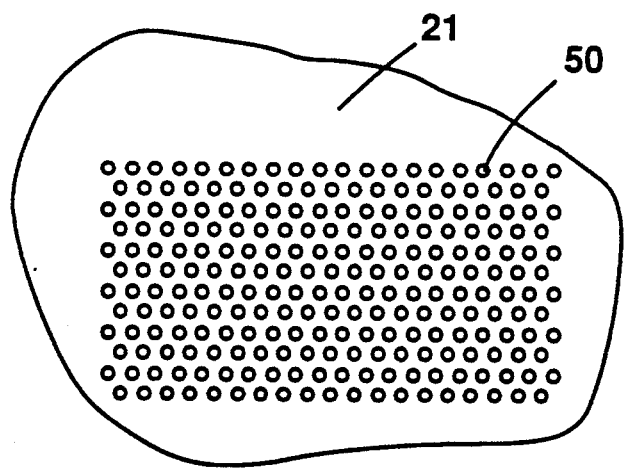

The third and most general class of cathodes to be described which incorporate the features of this invention includes those devices in which the magnetic field may be varied in two dimensions. The requirement for such a device is that it be capable of producing an arbitrary magnetic scalar potential on the plane 21 previously used to describe the operation of the more specialized embodiments. For practical purposes, it is sufficient to partition the plane 21 into a number of elements, where each element is small relative to the distance to the region where the magnetic field is to be used, and to provide a means for controlling the potential of each element. FIG. 10 shows the plane 21 partitioned into elements 50 having a square shape. Another example consisting of circular elements 50 arranged in a hexagonal pattern is shown in FIG. 11.

Figure 12A:
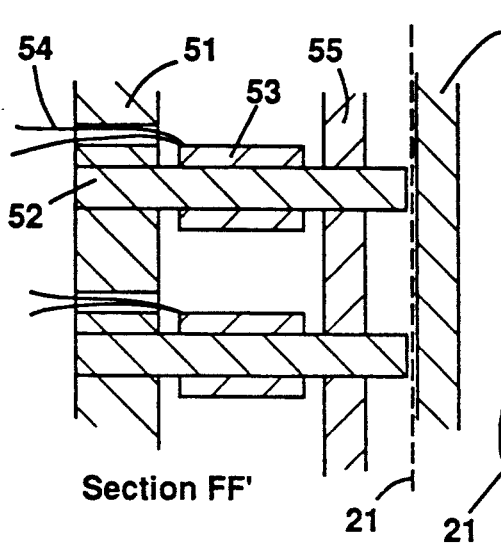
FIG. 12A is a cross-sectional view of a portion of a magnetron sputtering source made in accordance with this invention.
Figure 12B:
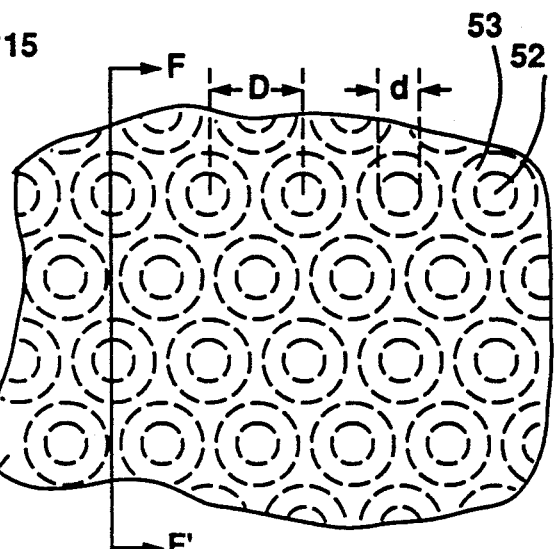
FIG. 12B shows the surface elements on the mathematical plane located between the magnetic structure and the target for the sputtering source shown in FIG. 12A.

The design shown in cross-sectional view in FIG. 12A is one means of generating the desired arbitrary potential. It consists of a baseplate 51 to which are attached a number of poles 52 of diameter d, arranged in a hexagonal pattern with lattice constant D. The baseplate and poles are made of a magnetic material such as Carpenter High Permeability 49 alloy. Each pole is surrounded by a coil 53, with leads 54 brought through a suitable hole in the baseplate. The poles 52 project through and are sealed to a plate 55 of nonmagnetic material such as copper. Plate 55 is parallel to baseplate 51 and provides a means of confining a flow of cooling water across the back surface of the target 15. Shown in plan view in FIG. 12B is the plane 21 which is convenient for describing the operation of the cathode. Plane 21 is coincident with the plane containing the ends of all the poles 52. Therefore, and arbitrarily defining the baseplate 51 to be at zero magnetic potential, the potential of any element of diameter d on the plane 21 is equal to the total current flowing through the coil associated with that element.

An exact description of the potential on the plane 21 given a set of currents in the coils 53 is not required to understand the operation of this invention. It is sufficient to recognize that each of the circles of diameter d and nearest neighbor separation D on the plane 21 are equipotentials, with a value proportional to the associated coil current, and that the potential in the region between adjacent elements varies approximately linearly. Consequently, any of the potential distributions described above in which the potential varies over a distance G is generated by a suitably high linear density 1/D of elements and by assigning to each element k a value of plus or minus $(k/K)[I/(2G)]$, $k=1,2,3\ldots K$, as appropriate. Some coils must carry the full current, unlike the one dimensional designs, where each coil carries a current I/n. The practicality of this design is considered below.

Substantial heat is generated in the plasma during the sputtering process and must be carried away by directly or indirectly cooling the back of the target by means such as a flow of water. This causes substantial problems in conventional designs because the typical magnet yoke 19 shown in FIG. 1 occupies this same location. Particularly in the case of a magnetic target, the ability of such a structure to generate a sufficiently strong magnetic field within the plasma depends critically on the separation between the yoke 19 and the target. In the case of concentric designs such as those shown in FIGS. 1, providing effective cooling water channels is difficult. The design shown in FIGS. 12A and 12B allows an easy and effective solution to this problem.

Figure 13A:
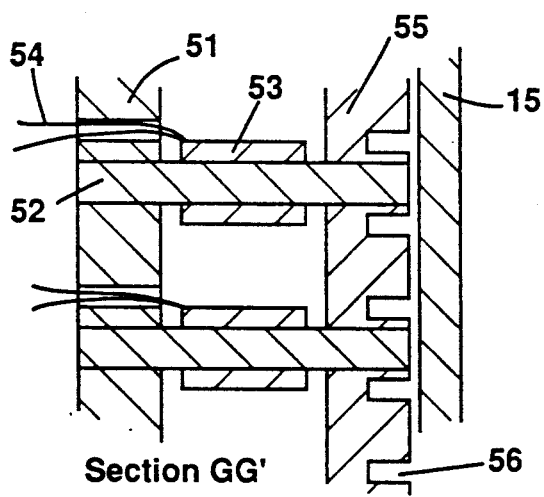
FIG. 13A is cross-sectional view of a portion of another sputtering source made in accordance with the principles of this invention.
Figure 13B:
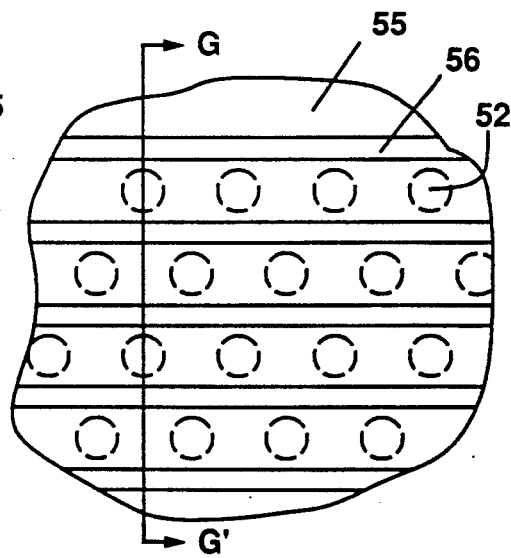
FIG. 13B is a plan view of a nonmagnetic plate shown in FIG. 13A.

Cooling the target 15 shown in FIG. 12A is accomplished by spacing the nonmagnetic plate 55 a suitable distance back from the plane containing the ends of the poles 52 and directing cooling water through the region bounded by the target and nonmagnetic plate. A suitable seal such as an O-ring contains the water at the common perimeter of plate 55 and target 15. Water inlet and outlet fittings (not shown) together with water baffles to prevent regions of stagnant flow complete the design. The water may be in contact with magnetic materials such as Carpenter High Permeability 49 Alloy because they are relatively corrosion resistant. The magnetic materials may also be protected by a thin coating. Another means of directing the flow of water is to provide cooling channels 56 on the surface of plate 55, as shown in cross section in FIG. 13A and in the plan view of plate 55 in FIG. 13B. The channels 56 may also be totally within plate 55 (not shown).

Figure 6B:
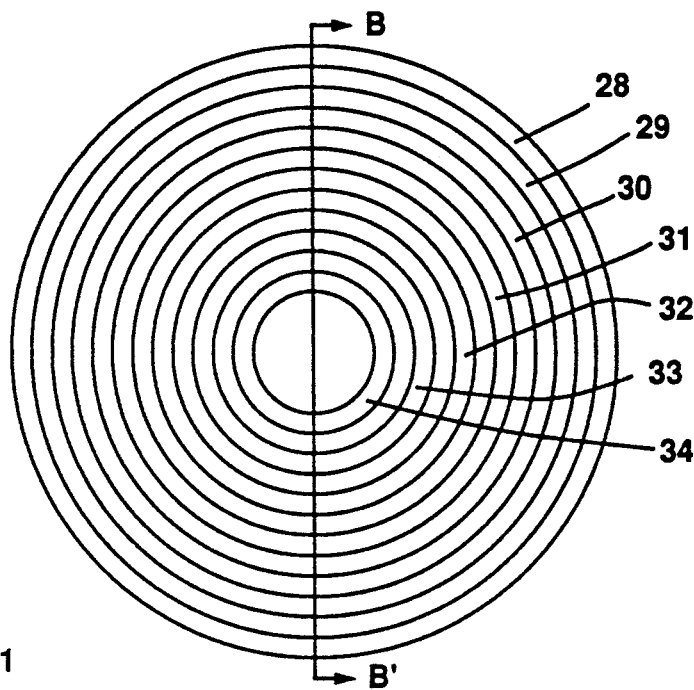
FIG. 6B is a plan view of the magnetic structure of a magnetron sputtering source made in accordance with this invention.

The one dimensional cathodes such as the radial design shown in FIG. 6 can be cooled with water while still maintaining intimate contact between the poles formed onto structure 28 and the target 15 by providing radial slots in the poles. FIG. 14B shows a plan view of structure 28 with radial slots 57 and FIGS. 14A and 14C show cross-sectional views. The slots produce little disturbance to the magnetic field distribution because the radial thickness of the poles is small. Suitable placement of the slots causes the poles to act as baffles to insure a uniform flow of water across the target. Water enters an inlet port 61, flows outward through slots 57 and the multiplicity of gaps (29 through 34 in FIGS. 6A and 6B) and exits through ports 62 in outer shroud 59. Coils within the gaps are sealed against the water by means 58 which could be epoxy. Shroud 59 is sealed to the target and structure 28 with O-rings 60. Shroud 59 may be made of either nonmagnetic or magnetic material. In the latter case, which is preferable, it may be an integral part of structure 28. Holes 63 provide a means of bringing the coil wires through structure 28.

A specific design will now be considered in order to address the practicality of the two dimensional approach. Consider the case d=0.125 and d/D=0.5 with a hexagonal pattern. The coils can have a maximum diameter of 0.25 inch. The permeability of Carpenter High Permeability 49 Alloy is in the range of 100,000. Therefore, to a very good approximation the baseplate 51 is an equipotential, the length of the poles 52 is not critical, and almost all of the magnetomotive force generated by the coils will appear across whatever air gaps exist between the target and the pole piece, or within or on the vacuum side of the target. Targets used to coat recording disks have a coercivity (in target form) of around 10 oersteds and a permeability of about 1,000. In order to establish a magnetic field within the plasma it is first necessary to saturate the target over a distance of about 2.5 cm, which requires a magnetomotive force of 2.5 cm $\times$ 10 Oe=19.9 Amp-turns. The additional magnetomotive force required to generate a typical field of 100 Oe within the plasma is about 312 Amp-turns. The coil cross-section required to produce 332 Ampturns is about 0.2 square inches (664 turns of #30 at 0.5 Amp). The required coil length is 1.6 inches which is a practical length.

Next consider the possibility of saturating the poles 52 prior to saturating the magnetic target. The permalloy targets used in fabricating thin film magnetic recording heads are notoriously difficult to saturate. The total flux in the target at saturation per unit length along the gap is $B_sT$, where $B_s$ is the saturation flux density of the target and T is its thickness. This flux must be handled by the poles. The fraction of the plane 21 covered by poles of diameter d in a hexagonal array ;of lattice constant D (center to center spacing) is $0.9069(d/D)^2$, or 0.227 for d/D=0.5. The effective saturation flux density of the array of poles is therefore 0.227 times that of the material from which the poles are made. Conservatively assuming that the saturation flux density of the target is as high as and equal to that of the material from which the poles are fabricated, it follows that the surface area of the cathode required to provide this flux is T/0.227 per unit length along the gap. This distribution of the flux among poles some distance from the intended region of target saturation will occur provided a reasonably small separation between the poles and target is maintained, and the design will saturate targets in the thickness range in common use.

Finally it must be emphasized that for equal magnetic fields the designs with one degree of freedom have a higher effective saturation flux density and operate at a lower coil current density.

It will be recognized that structures 28, 42, and 44 shown in the foregoing examples may be fabricated from a multiplicity of parts made of magnetic material rather than from one piece as shown. Similarly, the plane 51 to which elements 52 are attached could be omitted if a low reluctance path is established between elements 52 by direct contact between the elements.

What is claimed is:

1. A magnetron sputter coating assembly for sputtering a target material of a given thickness, comprising:
    a target of a given thickness from which said material is sputtered;
    a yoke of magnetic material adjacent to said target and configured with at least three concentric gaps, yoke portions being formed as pole pieces between said gaps for providing a magnetic field;
    separate electrical coils disposed within respective ones of said gaps;
    radial slots formed in each of said yoke portions, said slots being staggered and angularly nonaligned;
    means for directing a cooling medium or water through said slots and gaps; and
    means for selectively energizing at least two of said coils for establishing a magnetic field of a predetermined configuration.

2. A magnetron sputter coating assembly as in claim 1, wherein the thickness of each of said pole pieces is less than the thickness of said target.

3. A magnetron sputter coating assembly for sputtering a target material, comprising:
    a yoke of magnetic material configured as a comb-like structure, including a plurality of substantially equally spaced rectangular pole pieces disposed in a row, said row of pole pieces being disposed in a common plane, all but the first and last of said rectangular pole pieces of said row being substantially the same in size, and slots formed between adjacent pole pieces;
    a first electrical coil disposed within the first one of said slots and within one of said slots spaced from said first slot, so that said first coil encompasses a number q of adjacent pole pieces including the second one of said pole pieces in said row;
    a second electrical coil disposed within the second one of said slots and within one of said slots spaced from said second one of said slots so that said second coil encompasses said number q of adjacent pole pieces including the third one of said pole pieces in said row;
    successive electrical coils disposed within spaced slots along said row for encompassing said number q of adjacent pole pieces;
    all of said coils being in a plane parallel to said common plane;
    two magnetic end caps joined to said comb-like structure, said end caps having a portion spaced from said pole pieces for providing a space for accommodating portions of said electrical coils; and
    means for selectively energizing said coils.

4. A magnetron sputter coating assembly as in claim 3, wherein the spacing form the center to center of adjacent pole pieces is G/n, wherein G is said space provided between said end caps and said pole pieces, and n is the number of coils that are simultaneously active.

* * * * *